United States Patent [19]

Wada et al.

[11] 4,292,395
[45] Sep. 29, 1981

[54] PHOTOGRAPHIC PROCESS OF DEVELOPING AND ETCHING AN ELEMENT CONTAINING A TIN SULFIDE

[75] Inventors: Minoru Wada; Fumiaki Shinozaki; Yohnosuke Takahashi; Satoshi Yoshida, all of Asaka; Tomoaki Ikeda, Shizuoka, all of Japan

[73] Assignee: Fuji Photo Film Co., Ltd., Kanagawa, Japan

[21] Appl. No.: 177,965

[22] Filed: Aug. 14, 1980

[30] Foreign Application Priority Data

Aug. 17, 1979 [JP] Japan .................. 54-104680

[51] Int. Cl.$^3$ .............................. G03C 5/00
[52] U.S. Cl. .................. 430/299; 430/275; 430/278; 430/313; 430/323; 430/314
[58] Field of Search ............... 430/25, 275, 278, 313, 430/323, 314, 299

[56] References Cited

U.S. PATENT DOCUMENTS 3,762,325  10/1973  Hallman et al. ............... 101/453
4,205,989   6/1980  Moriya et al. ................ 430/306

Primary Examiner—Jack P. Brammer
Attorney, Agent, or Firm—Sughrue, Mion, Zinn, Macpeak & Seas

[57] ABSTRACT

A photosensitive image forming material comprising a tin sulfide image forming layer on a base and a photosensitive resin composition layer on said layer is disclosed. An image forming process using said material is also disclosed comprising imagewise exposing the same and then simultaneously developing the photosensitive resin composition layer and etching the exposed tin sulfide image forming layer. Alternatively, development and etching can be conducted as two separate steps.

4 Claims, 1 Drawing Figure

THICKNESS OF SnS LAYER vs. OPTICAL DENSITY

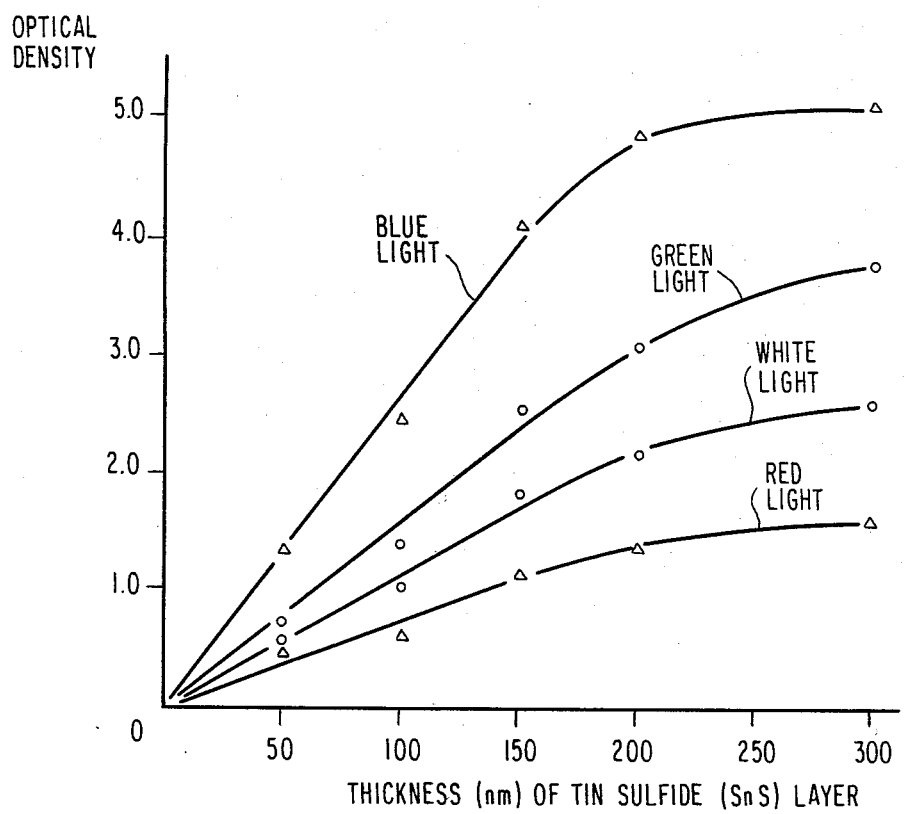

PHOTOGRAPHIC PROCESS OF DEVELOPING AND ETCHING AN ELEMENT CONTAINING A TIN SULFIDE

BACKGROUND OF THE INVENTION

1. Field of the Invention

The present invention provides photosensitive image forming materials obtainable at low cost which have various excellent properties such as high light-blocking property, high resolving power and stability with the passage of time, whereby image forming proceesing is shortened. Particularly, the invention relates to photosensitive image forming materials capable of providing images without a metallic luster. Particularly, the present invention relates to photosensitive image forming materials capable of obtaining a "see-through image" which substantially completely block radiation of a 300 to 500 nm wavelength but which pass any substantial red light and to a process for forming such a see-through image by a one bath development etching or by the two steps of development and etching.

2. Description of the Prior Art

An image forming process involving using a photosensitive image forming material comprising a photosensitive resin composition layer on a base and various thin metal layers between the base and the photosensitive resin composition layer which comprises imagewise exposing the photosensitive resin composition layer to light, developing and thereafter etching the thin metal layers is known.

Further, an image forming process using a photosensitive image forming material comprising a photosensitive resin composition layer on a base and a thin metal layer (such as aluminum or tellurium) between the base and the photosensitive resin composition layer which comprises imagewise exposing to light, developing and etching in one bath with using an aqueous alkaline solution to shorten processing is described in Japanese Patent Application (OPI) Nos. 65927/73 (the term "OPI" as used herein refers to a "published unexamined Japanese patent application"), 65928/73, 139720/75 (U.S. Pat. No. 4,008,084), 131625/76 (British Pat. No. 1,514,420), 99811/77, 99814/77, 99102/77, 109926/77 (British Pat. No. 1,546,739) and 99810/77 (U.S. Pat. No. 4,139,391).

These prior art processes yield excellent images having high light-blocking property, high resolving power and good edge sharpness, but the see-through capability, a characteristic of the present invention, cannot be obtained because of the use of a metal layer per se. The formation of see-through images has been desired in the art, because see-through images are very useful in, for example, the graphic arts for setting position, etc.

Further, one bath development etching is desirable because toxic solvents are not used and the process of image formation can be shortened.

SUMMARY OF THE INVENTION

The present invention relates to an improvement in the above prior art. The present invention provides see-through images which substantially completely block radiation of a 300 to 500 nm wavelength (to an extent of 97% or greater, preferably 99% or greater) but pass red light (wavelength: 600 to 800 nm) by a one bath development etching or by a two step development and etching.

In this embodiment, the present invention contemplates a photosensitive image forming material comprising a tin sulfide image forming layer on a base and a photosensitive resin composition layer on said image forming layer, wherein the tin sulfide image forming layer can optionally contain one or more of aluminum, tin, iron, silver, copper, zinc, indium, tellurium and bismuth at a molar ratio to tin sulfide of 1/20 to 1/1 (metal/tin sulfide).

The present invention further contemplates an image forming process which comprises:

(1) imagewise exposing the photosensitive image forming material with actinic radiation (e.g., near ultraviolet light having a wavelength of 290 to 500 nm, electron beams, etc.); and (2) developing said photosensitive resin composition layer by contact with an aqueous alkaline solution to simultaneously remove, by etching, the tin sulfide image forming layer in areas where the photosensitive resin composition layer is removed.

In the above image forming process, the photosensitive resin composition layer can be developed with an alkaline aqueous solution as a combined developing-/etching solution having a pH of 10 to 14 containing, e.g., sodium hydroxide, potassium hydroxide, sodium tertiary phosphate, disodium hydrogenphosphate, potassium tertiary phosphate, dipotassium hydrogenphosphate, sodium silicate or potassium silicate as an alkaline substance.

The present invention further contemplates an image forming process which comprises:

(1) imagewise exposing a photosensitive image forming material as above;

(2) removing the photosensitive resin composition layer corresponding to the imagewise exposure by contact with a developing solution for the photosensitive resin composition layer to expose the tin sulfide image forming layer; and (3) removing the tin sulfide image forming layer by etching in areas it is revealed by contact with an etching solution for said tin sulfide image forming layer.

The etching solution can be an aqueous alkaline solution having a pH of 10 to 14 containing, e.g., sodium hydroxide, potassium hydroxide, sodium tertiary phosphate, disodium hydrogenphosphate, potassium phosphate, dipotassium hydrogenphosphate, sodium silicate or potassium silicate.

BRIEF DESCRIPTION OF THE DRAWING

The figure shows the relationship of the optical density of blue light, green light, red light and white light to the thickness of a tin sulfide image forming layer per the present invention.

DETAILED DESCRIPTION OF THE INVENTION

As the base used in the present invention, conventional base materials as known in the art by, for example, U.S. Pat. No. 4,008,084, can be used, e.g., polyesters such as polyethylene terephthalate, polycarbonates, etc., cellulose acetate, glass and various kinds of paper, etc. The thickness of the base is in the range of 50 μm to 2 mm, preferably 80 μm to 1 mm.

Preferred tin sulfides comprising the image forming layer used in the present invention are those of the formula $SnS_x$ ($1 \leq x \leq 1.3$) because of their excellent see-through capability.

The tin sulfide layer can be formed on the above-described base by various processes, for example, vacuum evaporation, sputtering, ion plating, etc.

The thickness of the tin sulfide layer is preferably to be in the range of 40 nm to 500 nm, particularly 50 nm to 300 nm. The figure shows the relationship of the optical density of blue light (wavelength: 400 to 500 nm), green light (wavelength: 500 to 600 nm), red light (wavelength: 600 to 800 nm) and white light (wavelength 400 to 800 nm) to the thickness of tin sulfide layer.

Of course, one or more metals such as aluminum, tin, iron, silver, copper, zinc, indium, tellurium, bismuth, etc., may be added to the above-described tin sulfide image forming layer at a molar ratio to tin sulfide of 1/20 to 1/1 so as to not deteriorate seethrough capability.

The photosensitive resin composition layer applied to the above-described image forming layer can be formed using various known photosensitive resin compositions for resist formation (referred to as a photosensitive resin, hereinafter). The thickness of the photosensitive resin composition layer is in the range of 1 to 30 μm, preferably 1.5 to 10 μm.

The photosensitive resin can be freely selected from known compounds and compositions such as monomers, prepolymers and polymers where the molecular structure thereof chemically changes in a short period of time (e.g., ½ second to 2 minutes, preferably 2 seconds to 60 seconds) to result in a variation of physical properties between exposed and unexposed areas, e.g., in solubility to solvent, in tackiness, etc., when subjected to imagewise irradiation.

The above-described monomers or prepolymers as photosensitive resins are described in, for example, "Kogyogijutsu Library 33: Photosensitive Resins" written by Tatsuo Warashina et al and published by Nikkan Kogyo Shinbunsha, Feb. 21, 1972.

Photosensitive resins can be divided into various classes dependant on the criteria selected, e.g.:

based on the development method—into the dissolution type and the stripping type based on whether development is using a liquid medium (solvent) or by dry stripping (peel apart) development;

based on the type of image formed—into positive working and negative working types;

based on the type of chemical change upon exposure—into ones which undergo a cross-linking reaction due to the presence of metal ions, ones which dimerize when subjected to irradiation, ones which undergo cross-linking initiated by a decomposition product of a photodestructible substance coexistent therewith and ones which per se undergo polymerization when subjected to irradiation. Any of the above types of photosensitive resins may be used for preparing the photosensitive image forming materials of the present invention and not only is it contemplated that the many known materials can be used but photosensitive resins capable of forming a photosensitive resist layer developed in the future can also be applied to the photosensitive image forming materials of the present invention in the same manner as in the case of such known materials, irrespective of their classification.

In the case of photosensitive resins for producing a solvent dissolution type layer, a positive working type is one which decomposes upon exposure to light (as shown by, for example, the quinonediazides) to form a 5-membered ring compound with a carboxyl group which then is soluble in an alkali solution, whereby the resin layer in exposed areas can be removed by development with an alkali solution and the resin layer in unexposed areas remains as the desired image whereas a negative working type is one which becomes insoluble due to the formation of a macromolecular or network structure in areas exposed to light, e.g., photocross-linking of cinnamoyl groups or diazonium groups, etc., or photopolymerization of acrylamide or acrylic acid esters, etc., whereby unexposed areas of the photosensitive resin layer are removed using a suitable developing solution and the insoluble exposed areas remain to yield the desired image. Suitable examples of the developing solution include those including alkalis as described in, for example, U.S. Pat. No. 4,098,712, those including phosphorus acid, phosphoric acid or phosphorus acid and phosphoric acid as described in, for example, U.S. Pat. No. 4,124,516, and the like.

Solvent dissolution type photosensitive resins are in general used as a photosensitive materials for PS plates, wipe-on plates, photo-etching resists, etc.

As exemplary positive working type photosensitive resins, 1,2-naphthoquinonediazides can be used. Examples include 2,3,4-trioxybenzophenone-bis(naphthoquinone-1,2-diazido-5,5-sulfonic acid ester) as described in Japanese Patent Publication No. 18015/62, 2-(naphthoquinone-1,2-diazido-5-sulfonyloxy)hydroxy-7-naphthalene as described in Japanese Patent Publication No. 3627/62, naphthoquinone-1,2-diazido-5-sulfoanilide as described in Japanese Patent Publication No. 1954/62 and anthraquinone-1,2-diazido-5-sulfonic acid novolak esters as described in Japanese Patent Publication No. 9610/70, etc.

As exemplary negative working type photosensitive resins, many photosensitive materials such as diazonium salts, azide compounds and cinnamoyl group-containing compounds, etc., are known and these are useful herein.

Examples of diazonium salts useful as negative working type photosensitive resin include paraformaldehyde condensates of p-(phenylamino)benzenediazonium, and those described in U.S. Pat. No. 1,762,033 such as 4-dimethylaminobenzenediazonium hydrofluoroborate, 3-methyl-4-(dimethylamino)benzenediazonium sulfate and 3ethylnaphthalenediazonium.

Examples of azide compounds include p-phenylenebisazide, p-azidobenzophenone, 4,4'-diazidobenzophenone, 4,4'-diazidodiphenyl methane, 4,4'-diazidostilbene, 4,4'-diazidochalcone, 2,6-di(4'-azidobenzal)cyclohexanone and 2,6-di(4'-azidobenzal)-4-methylcyclohexanone, etc., as described in U.S. Pat. Nos. 2,852,379 and 2,940,853. These azide compounds are generally used as a "rubber photosensitive solution" by mixing the same with a rubber solution where the rubber can be a natural or synthetic rubber. In the case of synthetic rubbers, polyisoprene is often used, as described in Japanese Patent Publication No. 22084/70 (U.S. Pat. No. 3,488,194).

Examples of the polymers having azide groups in their molecule useful herein include polyvinyl azidobenzoate, polyvinyl azidophthalate and polyvinyl azidobenzalacetal, etc., as described in Japanese Patent Publication Nos. 28499/65 and 22085/70 (U.S. Pat. No. 3,475,176).

Examples of photosensitive resins comprising cinnamoyl groups useful as photosensitive resins herein include polyvinyl cinnamate and cinnamylideneacetic acid esters of polyvinyl alcohol such as polyvinyl cinnamylideneacetate, polyvinyl cinnamate cinnamylideneacetate, polyvinyl carboethoxymethylcarbamate cinnamylideneacetate and polyvinyl acetate cinnamylidene acetate.

In addition, a lot of known materials such as those having acryloyl groups, those using acrylamides and those using acrylates, can also be used as the photosensitive resin.

The above photosensitive resins can be liquid or solid. In the case of using a liquid resin, the resin is applied to the image forming layer which has been previously provided on the base, followed by drying in the customary manner. In the case of using a solid resin such is generally molded into film form and the film is put on the image forming layer and adhered thereto using pressure with, if necessary, heating. If desired, the solid resin can be dissolved in an organic solvent to prepare a solution which is then applied to the image forming layer. In order to form the photosensitive resin layers, processes hitherto known can be utilized. For example, in one such process a high-speed revolving coater called a "whirler" is used whereby application is carried out by revolving the object to be coated at a high rate, and such is preferred for use in the case of forming a very thin layer of the photosensitive resin.

In the image forming materials of the present invention, it is possible, if desired or necessary, to provide various conventional layers as are used in silver halide photographic sensitive materials, e.g., an antihalation layer or a protective layer, etc.

In order to form an image using the photosensitive image forming material of the present invention produced as above described, a mask having the desired image is used as an original and the photsensitive image forming material is imagewise exposed to light to form a latent image corresponding to the above-described image and the photosensitive resin layer is then developed to remove soluble areas of the resin layer by dissolution in the customary manner. The exposure to light is generally carried out by irradiation with near ultraviolet light (wavelength: 290 to 450 nm) or electron beams. The areas of the image forming layer where the resist is no longer present (corresponding to exposed areas) is then removed by dissolution, whereafter the photosensitive resin layer remaining as the resist is removed.

In such an image forming process, the photosensitive layer of the image forming material is exposed to light through the negative or positive original in the dark as in the case of conventional photographic processing. Since many photosensitive resins have high sensitivity to ultraviolet, it is preferred to use light sources having a high proportion of ultraviolet, such as superhigh pressure mercury lamps, xenon lamps, carbon arc lamps, chemical lamps, etc. Yellow lamps can be used as safety lamps.

As indicated, a latent image is formed in the photosensitive resin layer by the imagewise exposure. In the case that the photosensitive resin is soluble in solvents, the latent image provides a difference in solubility between exposed areas and unexposed areas of the photosensitive resin layer, namely, in the case of a positive working type resin, the photosensitive resin in unexposed areas remains as it is (insoluble) but exposed areas become soluble in the solvent, while in the case of a negative working type resin, the photosensitive resin is unexposed areas retains its property of dissolving in the solvent but in exposed areas becomes insoluble by hardening.

Examples of solvents used include water, aqueous alkali solutions which may contain organic solvents, and organic solvents per se. Examples of organic solvent which can be used include ketones such as methyl ethyl ketone, cellosolves such as methyl cellosolve acetate, ethyl cellosolve acetate and phenyl cellosolve acetate, and alcohols such as benzyl alcohol, but it is not construed to be limited to these specific examples.

Generally, exposed areas of positive working type resins become soluble in alkalis and exposed areas of negative working type resins become insoluble in water or organic solvents. Accordingly, development of the latent image is carried out by contacting the surface bearing the latent image with a solvent which dissolves either exposed areas or unexposed areas. Of course, in the case of using a photosensitive resin available in the marketplace, a developing solution designated by the manufacturer may be used.

In any case, the photosensitive resin layer remains in unexposed areas in the case of a positive working type resin and hardened photosensitive resin layer remains at exposed areas in the case of a negative working type resin, thereby to respectively yield an image, while the image forming layer is exposed at the unexposed areas where the photosensitive resin has been removed by dissolution.

The exposing image forming layer is then etched by contact with an etching solution for the image forming layer, e.g., by immersion therein, whereby the image forming layer is removed to expose the base. On the other hand, the residual photosensitive resin layer serves as a resist for the etching and the image forming layer below the resin layer remains without being etched to yield an image having an optical density which depends upon the thickness of the image forming layer.

The above-described process is for forming images by two steps: development and etching.

Further, included among the above-described photosensitive resins are photosensitive resins capable of development with alkalis after imagewise exposure. In the case of using such a photosensitive resin, it is possible to carry out one step processing, namely, a one bath development-etching, where the image forming layer is etched simultaneously with forming a resist pattern by development of the photosensitive resin layer after imagewise exposure.

As a developing solution for carrying out such a one bath development-etching, it is possible to use an aqueous solution of an alkali agent such as sodium hydroxide, potassium hydroxide, sodium tertiary phosphate, disodium hydrogenphosphate, potassium tertiary phosphate, dipotassium hydrogenphosphate, sodium silicate, potassium silicate, etc. The alkalinity of the alkaline aqueous solution is generally pH 10 to 14, preferably pH 11 to 13.5. It is, of course, possible to add alkali metal salts of bromic acid or iodic acid to the alkaline aqueous solution as described in Japanese Patent Application (OPI) No. 99101/77 (U.S. Pat. No. 4,098,712), whereby foaming in the case of using an alkali agent containing hydrogen can be prevented, whereby improved processing operations such as shortened development time, etc., can be obtained and image quality can be improved as the edges of the tin sulfide image become smoother.

Further, in the etching solution used for two bath developing which comprises etching the image forming layer after development of the photosensitive resin layer, it is possible to utilize conventional photographic additives such as hydrochloric acid, sulfuric acid, phosphoric acid, phosphorous acid or oxidants such as iron chloride in addition to the above-described alkali agents.

The following examples illustrate the present invention.

EXAMPLE 1

Tin sulfide (SnS) was applied to a polyethylene terephthalate base having 100 μm of the thickness by vacuum evaporation at $5 \times 10^{-5}$ Torr. The thickness of the tin sulfide image forming layer was 150 nm.

The following photosensitive resin was applied to the resultant image forming layer by a whirler so as to have a dry film thickness of about 1.5 μm and dried for 2 minutes at 100° C.

| | |
|---|---|
| Copolymer of methyl methacrylate and methacrylic acid (methacrylic acid/methyl methacrylate molar ratio: 25/75) | 1 g |
| Pentaerythritol tetraacrylate | 0.85 g |
| N-Methyl-2-benzoylmethylene-β-naphthothiazole | 0.06 g |
| Methyl ethyl ketone | 12 g |
| Methyl cellosolve acetate | 12 g |

The resulting photosensitive image forming material was imagewise exposed to light for 40 seconds through a half tone original using a 2 kw metal halide lamp (1 m distance) and then dipped for 30 seconds in a solution having the following composition at 31° C.

| | |
|---|---|
| NaOH | 4 g |
| KIO₃ | 18 g |
| Water | 1 l |

The optical densities of the resultant image were: 4.0—blue light; 2.5—green light; 1.0—red light; and 1.75—white light. The resolving power was more than 100 line pair/mm.

EXAMPLE 2

A tin sulfide (SnS) image forming layer containing aluminum in an amount of 20% by mole was formed on a polyethylene terephthalate base 100 μm thick by vacuum evaporation at $5 \times 10^{-5}$ Torr. The image forming layer was formed using an evaporation source for tin sulfide and an evaporation source for aluminum and controlling the temperatures thereof so as to each attach to the base at the same time at the desired evaporation rate. The thickness of the image forming layer was 150 nm. The following photosensitive resin was applied to the resultant image forming layer by a whirler so as to have a dry film thickness of about 1.5 μm and dried for 2 minutes at 100° C.

| | |
|---|---|
| 1,2-Naphthoquinonediazido-5-sulfonic acid ester of polyhydroxyphenyl obtained by polycondensation of acetone and pyrogallol described in Japanese Patent Publication No. 28403/68 (U.S. Pat. 3,635,709) | |
| Phenol resin (produced by Sumitomo Duretz Co., trade name: PR-5094, degree of polymerization: 3 to 10) | 2 g |
| Methyl ethyl ketone | 18 g |
| Methyl cellosolve acetate | 18 g |

The resultant photosensitive image forming material was imagewise exposed to light in the same manner as in Example 1 and thereafter developed as per Example 1. The optical density of the resultant image was: more than 3.0—blue light; and 1.3—white light. The resolving power was more than 100 line pairs/mm.

While the invention has been described in detail and with reference to specific embodiments thereof, it will be apparent to one skilled in the art that various changes and modifications can be made therein without departing from the spirit and scope thereof.

What is claimed is:

1. An image forming process which comprises:
   (1) imagewise exposing a photosensitive image forming material comprising a tin sulfide image forming layer on a base and a photosensitive resin composition layer on said layer with actinic radiation; and
   (2) developing said photosensitive resin composition layer by contact with an aqueous alkaline solution to simultaneously remove the tin sulfide image forming layer by etching in areas where said photosensitive resin composition layer has been removed.

2. The image forming process according to claim 1, wherein said photosensitive composition layer is developed with an alkaline aqueous solution having a pH of 10 to 14 containing sodium hydroxide, potassium hydroxide, sodium tertiary phosphate, disodium hydrogenphosphate, potassium tertiary phosphate, dipotassium hydrogenphosphate, sodium silicate or potassium silicate.

3. An image forming process which comprises:
   (1) imagewise exposing a photosensitive image forming material comprising a tin sulfide image forming layer on a base and a photosensitive resin composition layer on said layer with actinic radiation;
   (2) removing said photosensitive resin composition layer corresponding to said imagewise exposing by contact with a developing solution for said photosensitive resin composition layer to thereby expose the tin sulfide image forming layer; and
   (3) removing said tin sulfide image forming layer by etching the same in exposed areas by contact with an etching solution for said tin sulfide image forming layer.

4. The image forming process according to claim 3, wherein said etching solution is an aqueous alkaline solution having a pH of 10 to 14 containing sodium hydroxide, potassium hydroxide, sodium tertiary phosphate, disodium hydrogenphosphate, potassium tertiary phosphate, dipotassium hydrogenphosphate, sodium silicate or potassium silicate.

* * * * *